(12) United States Patent
Takizawa et al.

(10) Patent No.: US 11,716,810 B2
(45) Date of Patent: Aug. 1, 2023

(54) WIRING BOARD

(71) Applicant: SHINKO ELECTRIC INDUSTRIES CO., LTD., Nagano (JP)

(72) Inventors: Masaya Takizawa, Nagano (JP); Rie Mizutani, Nagano (JP); Hiroshi Taneda, Nagano (JP); Yoshiki Akiyama, Nagano (JP); Noriyoshi Shimizu, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 17/660,700

(22) Filed: Apr. 26, 2022

(65) Prior Publication Data

US 2022/0361331 A1    Nov. 10, 2022

(30) Foreign Application Priority Data

May 6, 2021    (JP) .................................. 2021-078612

(51) Int. Cl.
*H05K 1/02*    (2006.01)
*H05K 1/11*    (2006.01)

(52) U.S. Cl.
CPC ........... *H05K 1/113* (2013.01); *H05K 1/0271* (2013.01); *H05K 2201/0212* (2013.01); *H05K 2201/068* (2013.01)

(58) Field of Classification Search
CPC ................. H05K 1/0271; H05K 1/0313–0353
See application file for complete search history.

(56) References Cited

U.S. PATENT DOCUMENTS

2017/0256482 A1    9/2017    Furuichi et al.

FOREIGN PATENT DOCUMENTS

JP    2017-157666    9/2017

*Primary Examiner* — Jeremy C Norris
(74) *Attorney, Agent, or Firm* — IPUSA, PLLC (57) ABSTRACT

A wiring board includes a first interconnect structure including a first interconnect layer, and a first insulating layer including a non-photosensitive thermosetting resin as a main component thereof, a second interconnect structure including second interconnect layers, and second insulating layers including a photosensitive resin as a main component thereof, and laminated on the first interconnect structure, and an encapsulating resin layer including a non-photosensitive thermosetting resin as a main component thereof, and laminated on an uppermost second insulating layer. An uppermost second interconnect layer includes a pad protruding from the uppermost second insulating layer. The encapsulating resin layer exposes a top surface of the pad, and covers at least a portion of a side surface of the pad. Thermal expansion coefficients of the first insulating layer and the encapsulating resin layer are lower than that of the second insulating layers.

7 Claims, 5 Drawing Sheets

WIRING BOARD

CROSS-REFERENCE TO RELATED APPLICATIONS

This application is based upon and claims priority to Japanese Patent Application No. 2021-078612, filed on May 6, 2021, the entire contents of which are incorporated herein by reference.

FIELD

The present disclosure relates to wiring boards, and methods for manufacturing wiring boards.

BACKGROUND

Conventionally, as wiring boards on which electronic components, such as semiconductor chips or the like are mounted, there is a known wiring board having multiple interconnect layers and multiple insulating layers that are alternately laminated by a build-up method, in order to increase the density of interconnect patterns. This type of wiring board proposed in Japanese Laid-Open Patent Publication No. 2017-157666, for example, has a high-density interconnect layer including an insulating layer made of a photosensitive resin, formed on a low-density interconnect layer including an insulating layer made of a thermosetting resin.

However, the proposed wiring board described above may warp due to a difference between thermal expansion coefficients of the insulating layer made of the thermosetting resin and the insulating layer made of the photosensitive resin.

SUMMARY

One aspect of embodiments provides a wiring board having a reduced warp.

According to one aspect of the embodiments, a wiring board includes a first interconnect structure including a first interconnect layer, and a first insulating layer that includes a non-photosensitive thermosetting resin as a main component thereof; a second interconnect structure including a plurality of second interconnect layers, and a plurality of second insulating layers that includes a photosensitive resin as a main component thereof, the second interconnect structure being laminated on the first interconnect structure; and an encapsulating resin layer that includes a non-photosensitive thermosetting resin as a main component thereof, the encapsulating resin layer being laminated on an uppermost layer of the plurality of second insulating layers, wherein an uppermost layer of the plurality of second interconnect layers includes a pad protruding from the uppermost layer of the plurality of second insulating layers, the encapsulating resin layer exposes a top surface of the pad, and covers at least a portion of a side surface of the pad, and a thermal expansion coefficient of the first insulating layer and a thermal expansion coefficient of the encapsulating resin layer are lower than a thermal expansion coefficient of the plurality of second insulating layers.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Preferred embodiments of the present invention will be described with reference to the accompanying drawings. In the drawings, those parts that are the same are designated by the same reference numerals, and a repeated description of the same parts may be omitted.

First Embodiment

Configuration of Wiring Board

Figure 1:
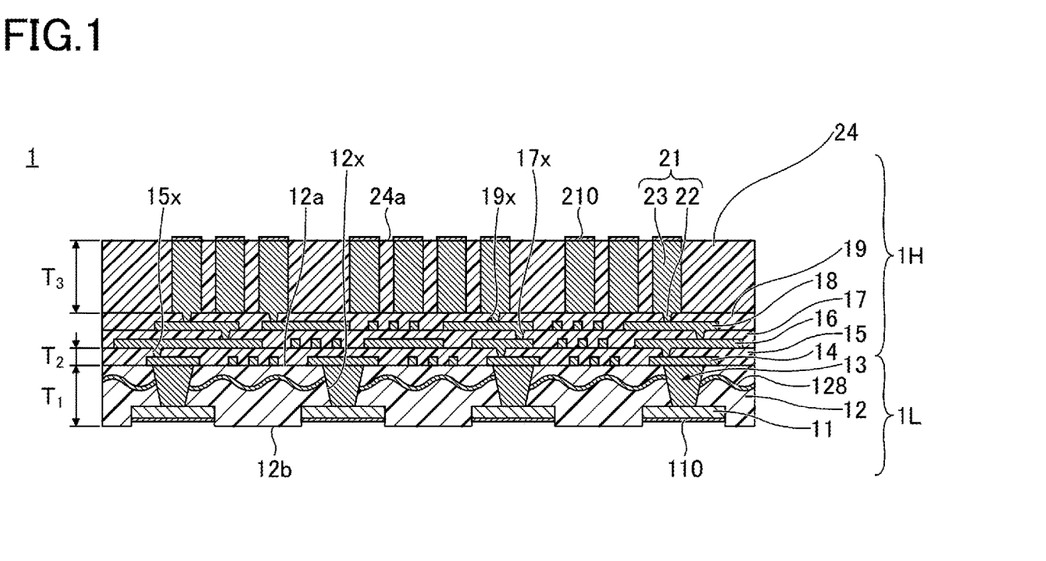
FIG. 1 is a cross sectional view illustrating an example of a wiring board according to a first embodiment.

First, a configuration of a wiring board according to a first embodiment will be described. FIG. 1 is a cross sectional view illustrating an example of the wiring board according to the first embodiment.

As illustrated in FIG. 1, a wiring board 1 according to the first embodiment includes a first interconnect structure 1L, a second interconnect structure 1H laminated on the first interconnect structure 1L, and an encapsulating resin layer 24 laminated on the second interconnect structure 1H. A planar shape of the wiring board 1 may be a square shape or a rectangular shape, for example. However, the planar shape of the wiring board 1 is not particularly limited, and the wiring board 1 may have an arbitrary planar shape.

The first interconnect structure 1L includes a low-density interconnect layer formed with an interconnect layer having a lower interconnect density than the second interconnect structure 1H. The first interconnect structure 1L includes an interconnect layer 11, an insulating layer 12, and an interconnect layer 13. In contrast, the second interconnect structure 1H includes a high-density interconnect layer formed with an interconnect layer having a higher interconnect density than the first interconnect structure 1L. The second interconnect structure 1H includes an interconnect layer 14, an insulating layer 15, an interconnect layer 16, an insulating layer 17, an interconnect layer 18, an insulating layer 19, and an interconnect layer 21.

In the present embodiment, for the sake of convenience, a top-side or one side of the wiring board 1 refers to the side of the wiring board 1 provided with an encapsulating resin layer 24, and a bottom-side or the other side of the wiring board 1 refers to the side of the wiring board 1 provided with the insulating layer 12. In addition, one surface or a top surface of each part of the wiring board 1 refers to the surface on the side provided with the encapsulating resin layer 24, and the other surface of a bottom surface of each part of the wiring board 1 refers to the surface on the side provided with the insulating layer 12. However, the wiring board 1 may be used in an upside-down state, or may be disposed at an arbitrary angle. Further, a plan view of an object refers to a view of the object viewed in a normal direction to a top surface 24a of the encapsulating resin layer 24, and a planar shape refers to a shape of the object in the plan view, that is, the shape of the object viewed in the normal direction to the top surface 24a of the encapsulating resin layer 24.

The interconnect layer 11 is a lowermost layer of the interconnect layers, and is exposed on the side of a bottom surface of the insulating layer 12. A top surface and a side surface of the interconnect layer 11 are covered by the insulating layer 12. A bottom surface of the interconnect layer 11 is exposed at a position recessed from a bottom surface 12b of the insulating layer 12 toward the side provided with the interconnect layer 13, for example. However, the top surface of the interconnect layer 11 may coincide with the bottom surface 12b of the insulating layer 12. Alternatively, a portion of the side surface and the bottom surface of the interconnect layer 11 may protrude downward from the bottom surface 12b of the insulating layer 12.

The interconnect layer 11 is a circular pad having a planar shape with a diameter of approximately 150 μm, for example, and may include an interconnect pattern. A spacing between adjacent interconnect layers 11 may be approximately 200 μm, for example. A material, such as copper (Cu) or the like, for example, may be used for the interconnect layer 11. A thickness of the interconnect layer 11 may be in a range of approximately 10 μm to approximately 20 μm, for example. The interconnect layer 11 may be used as an external connection terminal (or pad) for making an electrical connection with other wiring boards.

A surface treatment layer 110 may be formed on the bottom surface of the interconnect layer 11. Examples of the surface treatment layer 110 include a Au layer, a Ni/Au layer (a metal layer in which a Ni layer and a Au layer are laminated in this order), a Ni/Pd/Au layer (a metal layer in which a Ni layer, a Pd layer, and a Au layers are laminated in this order), or the like. Moreover, the bottom surface of the interconnect layer 11 may be subjected to an anti-oxidation treatment, such as an Organic Solderability Preservative (OSP) treatment or the like.

The insulating layer 12 covers the top surface and the side surface of the interconnect layer 11. The insulating layer 12 includes a non-photosensitive thermosetting resin as a main component thereof, and a reinforcing member 128. The insulating layer 12 may be configured to include the reinforcing member 128 impregnated with the non-photosensitive thermosetting resin. Herein, "includes a non-photosensitive thermosetting resin as a main component thereof" means that other components, such as a filler or the like, may be included in addition to the thermosetting resin.

Examples of the non-photosensitive thermosetting resin used for the insulating layer 12 include epoxy resins, imide resins, phenolic resins, cyanate-based resins, or the like, for example. Examples of the reinforcing member 128 include woven and non-woven fabrics such as glass fiber, carbon fiber, aramid fiber, or the like, for example. Examples of the filler included in the insulating layer 12 include silica ($SiO_2$), kaolin ($Al_2Si_2O_5(OH_4)$), talc ($Mg_3Si_4O_{10}(OH_2)$), alumina ($Al_2O_3$), or the like, for example. In addition, the filler may include a mixture of such materials. For example, glass cloth using glass fiber bundles, and carbon fiber bundles, polyester fiber bundles, nylon fiber bundles, aramid fiber bundles, or the like may also be used as the reinforcing member 128.

A thickness $T_1$ of the insulating layer 12 may be in a range of approximately 60 to approximately 70 μm, for example. A thermal expansion coefficient (or coefficient of thermal expansion) of the insulating layer 12 may be in a range greater than or equal to 5 ppm/° C. and less than or equal to 10 ppm/° C. The thermal expansion coefficient of the insulating layer 12 may be adjusted to a predetermined value by a filler content, a composition of the insulating resin, or the like, for example. The thermal expansion coefficient of the insulating layer 12 is lower than the thermal expansion coefficient of each of the insulating layers 15, 17, and 19.

The reinforcing member 128 is unevenly distributed inside the insulating layer 12, and are distributed more on the side of the second interconnect structure 1H (that is, the top side) relative to a center along a thickness direction of the insulating layer 12. Specifically, the reinforcing member 128 is arranged at a position offset toward the side of the second interconnect structure 1H from the center along the thickness direction of the insulating layer 12. More particularly, in the insulating layer 12, a thickness of the resin layer from the top surface 12a of the insulating layer 12 to the reinforcing member 128, is set smaller than a thickness of the resin layer from the reinforcing member 128 to the bottom surface 12b of the insulating layer 12.

The top surface 12a of the insulating layer 12 is a smooth surface, that is, a low-roughness surface, having little irregularities. For example, the top surface 12a of the insulating layer 12 is a polished surface. The top surface 12a of the insulating layer 12 has a smaller surface roughness than an inner sidewall surface of a via hole 12x. The roughness of the top surface 12a of the insulating layer 12 is set to have a surface roughness Ra with a value in a range of approximately 15 nm to approximately 40 nm, for example. Further, the roughness of the inner sidewall surface of the via hole 12x is set to have a surface roughness Ra with a value in a range of approximately 300 nm to approximately 400 nm, for example. The value of the surface roughness Ra is a kind of numerical value representing the surface roughness, and is also referred to as an arithmetic mean roughness. The arithmetic mean roughness is obtained by measuring an absolute value of a height varying within a measurement range, from an average value (or average line) of the surface irregularities, and determining an arithmetic average of the measured absolute value.

The interconnect layer 13 is a via interconnect embedded in the insulating layer 12. More particularly, the interconnect layer 13 is the via interconnect filling the via hole 12x which penetrates the insulating layer 12 and exposes the top surface of the interconnect layer 11. The interconnect layer 13 is electrically connected to the interconnect layer 11. The via hole 12x may be a recess having an inverted truncated cone shape. A diameter of a first opening of the via hole 12x which opens at the insulating layer 15, may be greater than a diameter of a second opening of the via hole 12x which opens at the top surface of the interconnect layer 11. A bottom surface of the second opening of the via hole 12x is formed by the top surface of the interconnect layer 11. The first opening of the via hole 12x may have a diameter in a range of approximately 60 μm to approximately 70 μm, for example.

A top surface of the interconnect layer 13, which is the via interconnect, is exposed from the top surface 12a of the insulating layer 12. The top surface of the interconnect layer 13 may coincide with the top surface 12a of the insulating layer 12, for example. The top surface of the interconnect layer 13 is directly bonded to a bottom surface of the interconnect layer 14. In addition, a bottom surface of the interconnect layer 13 is directly bonded to the interconnect layer 11 within the insulating layer 12. A material used for the interconnect layer 13 may be similar to the material used for the interconnect layer 11, for example.

Similar to the top surface 12a of the insulating layer 12, the top surface of the interconnect layer 13 is a smooth surface, that is, a low-roughness surface, having little irregularities. For example, the top surface of the interconnect layer 13 is a polished surface. The roughness of the top surface of the interconnect layer 13 is set to have a surface roughness Ra with a value in a range of approximately 15 nm to approximately 40 nm, for example.

In the present embodiment, the interconnect layer 13 is formed solely of the via interconnect formed in the via hole 12x of the insulating layer 12. In other words, the interconnect layer 13 includes no interconnect pattern formed integrally on the top surface 12a of the insulating layer 12. The interconnect layer 13 and interconnect layer 14 are electrically connected, but are not formed integrally. More particularly, in a method for manufacturing the wiring board which will be described later, when the interconnect layer 14 is formed by the semi-additive method, a seed layer is interposed between the top surface of the interconnect layer 13 and a bottom surface of the interconnect layer 14. The reason for employing such a configuration is to form a high-density interconnect pattern, having a line-and-space (L/S) of approximately 3 μm/3 μm, as the interconnect layer 14 described below. A description of the interconnect layer 14 in more detail will be given later in conjunction with the method for manufacturing the wiring board 1.

The interconnect layer 14 is formed on the top surface 12a of the insulating layer 12. The interconnect layer 14 is formed directly on the top surface 12a of the insulating layer 12, and includes an interconnect, such as interconnect patterns and pads, electrically connected to the interconnect layer 11 through the interconnect layer 13. In other words, a portion of the bottom surface of the interconnect layer 14 is in contact with the top surface of the interconnect layer 13, and the interconnect layer 14 and the interconnect layer 13 electrically connected to each other. A material, such as copper (Cu) or the like, for example, may be used for the interconnect layer 14. The interconnect layer 14 may be a laminated film including a plurality of laminated conductor layers.

The interconnect layer 14 has a higher interconnect density, that is, a narrower line-and-space (L/S), than the interconnect layer 11. Further, the interconnect layer 14 is thinner than the interconnect layer 11. In this specification, an interconnect layer having a line-and-space (L/S) less than or equal to 8 μm/8 μm is regarded as an interconnect layer having a high interconnect density. The line-and-space (L/S) of the interconnect layer 14 may be in a range of approximately 1 μm/1 μm to approximately 3 μm/3 μm, for example. The thickness of the interconnect layer 14 may be in a range of approximately 1 μm to approximately 3 μm, for example.

The line of the line-and-space (L/S) represents a trace width (or width of interconnect), and the space of the line-and-space (L/S) represents a spacing of adjacent interconnects (or space between adjacent interconnects). For example, when the line-and-space (L/S) is represented as 2 μm/2 μm, the trace width is 2 μm, and the spacing of the adjacent interconnects is 2 μm.

The insulating layer 15 is an insulating layer that includes a photosensitive resin as a main component thereof. The insulating layer that "includes a photosensitive resin as a main component" means that the insulating layer may include components other than the photosensitive resin, such as a filler or the like. For example, the insulating layer 15 may include a filler, such as silica ($SiO_2$) or the like.

The insulating layer 15 is formed on the top surface 12a of the insulating layer 12, so as to cover the interconnect layer 14. Examples of the photosensitive resin used for the insulating layer 15 include an insulating resin, such as phenolic resins, polyimide resins, or the like, for example. A thickness $T_2$ of the insulating layer 15 may be in a range of approximately 5 μm to approximately 10 μm, for example. A thermal expansion coefficient of the insulating layer 15 may be in a range greater than or equal to 40 ppm/° C. and less than or equal to 60 ppm/° C., for example. The thermal expansion coefficient of the insulating layer 15 may be adjusted to a predetermined value by a filler content, a composition of the insulating resin, or the like, for example.

The interconnect layer 16 is formed on one side of the insulating layer 15, and is electrically connected to the interconnect layer 14. The interconnect layer 16 includes a via interconnect filling the via hole 15x which penetrates the insulating layer 15 to expose a top surface of interconnect layer 14, and an interconnect pattern formed on a top surface of insulating layer 15. The via hole 15x may be a recess having an inverted truncated cone shape. A diameter of a first opening of the via hole 15x which opens at the insulating layer 17, may be greater than a diameter of a second opening of the via hole 15x which opens at the top surface of the interconnect layer 14. A bottom surface of the second opening of the via hole 15x is formed by the top surface of the interconnect layer 14. The first opening of the via hole 15x may have a diameter in a range of approximately 10 μm to approximately 20 μm, for example. A material used for the interconnect layer 16, and a thickness of the interconnect pattern forming the interconnect layer 16 may be similar to those of the interconnect layer 14, for example.

The line-and-space (L/S) of the interconnect layer 16 may be in a range of approximately 1 μm/1 μm to approximately 3 μm/3 μm, for example, but this line-and-space (L/S) may be narrower than that of the interconnect layer 14. In other words, the top surface 12a of the insulating layer 12 is a polished surface, and is smoother than the bottom surface 12b of the insulating layer 12. The top surface of the insulating layer 15 including the photosensitive resin as the main component thereof, is even smoother than the top surface 12a of the insulating layer 12 including the non-photosensitive thermosetting resin as the main component thereof. For this reason, the line-and-space (L/S) of the interconnect layer 16 can be made narrower than the line-and-space (L/S) of the interconnect layer 14. For example, the line-and-space (L/S) of the interconnect layer 14 may be 3 μm/3 μm, and the line-and-space (L/S) of the interconnect layer 16 may be 1 μm/1 μm. The same applies to the interconnect layer 18 which will be described later.

The insulating layer 17 is formed on one surface of the insulating layer 15, so as to cover the interconnect layer 16. A material used for the insulating layer 17, and a thickness and a thermal expansion coefficient of the insulating layer 17, may be similar to those of the insulating layer 15. The insulating layer 17 may include a filler, such as silica ($SiO_2$) or the like.

The interconnect layer 18 is formed on one side of the insulating layer 17, and is electrically connected to the interconnect layer 16. The interconnect layer 18 includes a via interconnect filling a via hole 17x which penetrates the insulating layer 17 to expose a top surface of the interconnect layer 16, and an interconnect pattern formed on the top surface of the insulating layer 17. The via hole 17x may be a recess having an inverted truncated cone shape. A diameter of a first opening of the via hole 17x which opens at the insulating layer 19, may be greater than a diameter of a second opening of the via hole 17x which opens at the top surface of the interconnect layer 16. A bottom surface of the second opening of the via hole 17x is formed by the top surface of the interconnect layer 16. The first opening of the via hole 17x may have a diameter in a range of approximately 10 μm to approximately 20 μm, for example. A material used for the interconnect layer 18, and a thickness of the interconnect pattern forming the interconnect layer 18 may be similar to those of the interconnect layer 14, for example. The line-and-space (L/S) of the interconnect layer 18 may be similar to that of the interconnect layer 16, for example.

The insulating layer 19 is formed on one surface of the insulating layer 17, so as to cover the interconnect layer 18. In the second interconnect structure 1H, the insulating layer 19 is an uppermost insulating layer. A material used for the insulating layer 19, and a thickness and a thermal expansion coefficient of the insulating layer 19, may be similar to those of the insulating layer 15, for example. The insulating layer 19 may include a filler, such as silica ($SiO_2$) or the like.

The interconnect layer 21 is formed on one side of the insulating layer 19. In the second interconnect structure 1H, the interconnect layer 21 is an uppermost interconnect layer. The interconnect layer 21 includes a via interconnect 22 filling a via hole 19x which penetrates the insulating layer 19 to expose a top surface of the interconnect layer 18, and a pad 23 protruding from a top surface of the insulating layer 19. The via hole 19x may be a recess having an inverted truncated cone shape. A diameter of a first opening of the via hole 19x which opens at the pad 23, may be greater than a diameter of a second opening of the via hole 19x which opens at the top surface of the interconnect layer 18. A bottom surface of the second opening of the via hole 19x is formed by the top surface of the interconnect layer 18. The first opening of the via hole 19x may have a diameter in a range of approximately 10 μm to approximately 20 μm, for example.

A material used for the interconnect layer 21 may be similar to that of the interconnect layer 14, for example. A thickness of the interconnect layer 21, which is a sum of a thickness of the via interconnect 22 and a thickness of the pad 23, may be approximately 100 μm, for example. The thickness of pad 23, which is the thickness from the top surface of insulating layer 19 to the top surface of pad 23, may be in a range of 80 μm to 150 μm, for example. The planar shape of the pad 23 may be a circular shape having a diameter in a range of approximately 20 μm to approximately 30 μm, for example. A pitch of the pads 23 may be in a range of approximately 40 μm to approximately 50 μm, for example. A portion of the pad 23 exposed from the encapsulating resin layer 24 may be used as an external connection terminal for making an electrical connection with a semiconductor chip.

A surface treatment layer 210, similar to the surface treatment layer 110, may be formed on a top surface of the pad 23. In a case where a portion of side surface and the top surface of the pad 23 protrude from the top surface 24a of the encapsulating resin layer 24, the surface treatment layer 210 is formed only on the top surface of the pad 23, or on a portion of the side surface and the top surface of the pad 23.

The encapsulating resin layer 24 is laminated on the insulating layer 19 which is the uppermost insulating layer of the second interconnect structure 1H. The encapsulating resin layer 24 exposes the top surface of the pad 23, and covers at least a portion of the side surface of the pad 23. The encapsulating resin layer 24 may expose the top surface of the pad 23, and cover the entirety of the side surface of the pad 23. In this case, the top surface of the pad 23 coincides with the top surface 24a of the encapsulating resin layer 24, for example. However, a portion of the side surface and the top surface of the pad 23 may protrude from the top surface 24a of the encapsulating resin layer 24, or the top surface of the pad 23 may be exposed at a recessed position than the top surface 24a of the encapsulating resin layer 24. In a case where a portion of the side surface and the top surface of the pad 23 are made to protrude from the top surface 24a of the encapsulating resin layer 24, a spacing can be secured between the encapsulating resin layer 24 and the semiconductor chip, and thus, it becomes easier to fill an underfill resin between the encapsulating resin layer 24 and the semiconductor chip.

A material used for the encapsulating resin layer 24 may be a mold resin, for example. The mold resin is an insulating resin including a non-photosensitive thermosetting resin as a main component thereof, which may be used for methods such as transfer molding, compression molding, injection molding, or the like. The mold resin is an insulating resin, such as a non-photosensitive thermosetting epoxy resin or the like, for example, and may include a filler similar to that of the insulating layer 12, but does not include a reinforcing member such as glass fiber or the like.

From a viewpoint of reducing a warp of the wiring board 1, a thickness $T_3$ of the encapsulating resin layer 24 is preferably greater than the thickness $T_1$ of the insulating layer 12. For example, when the thickness $T_1$ of the insulating layer 12 is in a range of 60 μm to 70 μm, the thickness $T_3$ of the encapsulating resin layer 24 may be in a range of 80 μm to 150 μm. A thermal expansion coefficient of the encapsulating resin layer 24 is lower than the thermal expansion coefficient of each of the insulating layers 15, 17, and 19.

In addition, from the viewpoint of reducing the warp of the wiring board 1, the thermal expansion coefficient of the encapsulating resin layer 24 is preferably approximately the same as the thermal expansion coefficient of the insulating layer 12. Herein, "approximately the same" means that the thermal expansion coefficient of the encapsulating resin layer 24 is ±20% or less with respect to the thermal expansion coefficient of the insulating layer 12.

For example, when the thermal expansion coefficient of the insulating layer 12 is in a range greater than or equal to 5 ppm/° C. and less than or equal to 10 ppm/° C., the thermal expansion coefficient of the encapsulating resin layer 24 is preferably in a range greater than or equal to 5 ppm/° C. and less than or equal to 10 ppm/° C. The thermal expansion coefficient of the encapsulating resin layer 24 may be adjusted to a predetermined value by a filler content, a composition of the insulating resin, or the like, for example.

Method For Manufacturing Wiring Board According to First Embodiment

Next, a method for manufacturing the wiring board according to the first embodiment will be described. FIG. 2A through FIG. 4C are diagrams illustrating an example of a manufacturing process of the wiring board according to the first embodiment. Although the manufacturing process of one wiring board is illustrated in this example, the manufacturing process may form a plurality of parts which become wiring boards, and thereafter singulate the plurality of wiring boards to form each wiring board. In addition, although the layer structure is formed only on one side of a support in this example, the layer structure may be formed on both the one side and the other side of the support.

Figure 2A:
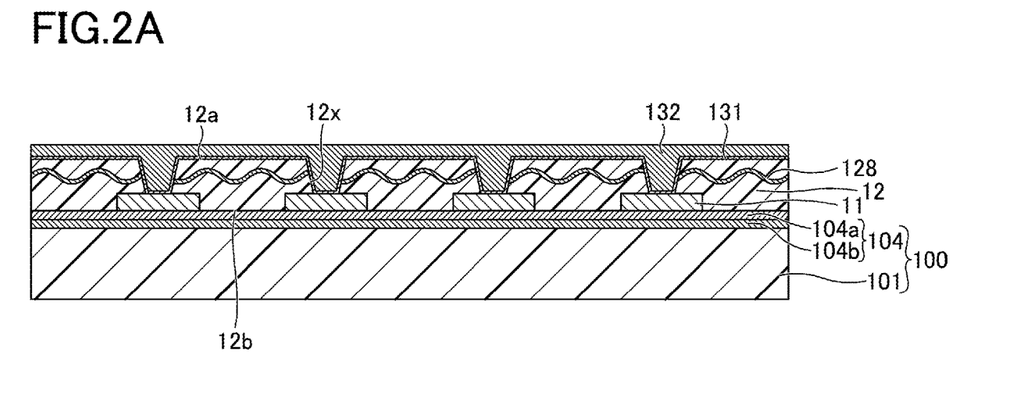
FIG. 2A, FIG. 2B, and FIG. 2C are diagrams (part 1) illustrating an example of a manufacturing process of the wiring board according to the first embodiment.

First, in the process illustrated in FIG. 2A, a support 100 is prepared, the interconnect layer 11 and the insulating layer 12 are formed on the support 100, the via hole 12x is formed in the insulating layer 12, and a laminated structure of a seed layer 131 and an electrolytic plating layer 132 is formed on the insulating layer 12 inside the via hole 12x.

The support 100 has a laminated structure in which a carrier-added copper film 104 is laminated on one side of a core substrate 101, for example. The core substrate 101 is a resin substrate having a thickness of approximately 0.7 mm, for example, and the resin substrate and may include a reinforcing member, such as a glass fiber or the like. The carrier-added copper film 104 has a structure in which a thin film 104a made of copper and having a thickness in a range of approximately 1.5 pm to approximately 5 μm, for example, is attached to a thick film (carrier film) 104b made of copper and having a thickness in a range of approximately 10 μm to approximately 50 μm, for example, via a release layer (not illustrated), in a state where the thin film 104a is strippable. The thick film 104b is provided as a support material to facilitate handling of the thin film 104a.

The structure of the support 100 described above is merely an example, and the structure of the support 100 is not particularly limited. For example, the support 100 may use a laminated body in which a plurality of prepregs are laminated, in place of the core substrate 101. In addition, the support 100 may have a structure in which the carrier-added copper film 104 is arranged on one side of a substrate, such as a glass substrate, a metal substrate, or the like, via a release layer.

Once the support 100 is prepared, the interconnect layer 11 is first formed on one side of the support 100. More particularly, a resist layer having an opening in a portion where the interconnect layer 11 is to be formed, is formed on the top surface of the carrier-added copper film 104 (top surface of the thin film 104a) using a dry film resist or the like. Then, the interconnect layer 11, which is an electrolytic plating layer, is formed on the top surface of the carrier-added copper film 104 exposed inside the opening, by electrolytic plating using the carrier-added copper film 104 as a power feeding layer. The material used for the interconnect layer 11, and the thickness of the interconnect layer 11 are as described above. Thereafter, the resist layer is stripped.

Next, the insulating layer 12 covering the interconnect layer 11 is formed on the top surface of the carrier-added copper film 104. More particularly, a film of an insulating resin in a semi-cured state, including a non-photosensitive thermosetting resin as a main component thereof, and a reinforcing member 128, is prepared. The insulating resin is then laminated to the top surface of the carrier-added copper film 104, and is cured while being heated and pressed, to thereby form the insulating layer 12. The material used for the insulating layer 12, and the thickness, the thermal expansion coefficient, or the like of the insulating layer 12, are as described above.

Next, the via hole 12x, which penetrates the insulating layer 12 and exposes the top surface of the interconnect layer 11, is formed in the insulating layer 12. The via hole 12x may be formed by a laser beam machining using a $CO_2$ laser, a YAG laser, an excimer laser, or the like, for example. After forming the via hole 12x, a desmear treatment is preferably performed to remove resin residue adhered to the surface of the interconnect layer 11 exposed at the bottom of each via hole 12x.

Next, a laminated structure of the seed layer 131 and the electrolytic plating layer 132 is formed on the top surface 12a of the insulating layer 12 inside the via hole 12x, using a semi-additive method, for example. More particularly, the seed layer 131 is first formed on the top surface 12a of the insulating layer 12, the inner sidewall surface of the via hole 12x, and the top surface of the interconnect layer 11 exposed inside the via hole 12x, by electroless plating or sputtering. A copper layer having a thickness in a range of approximately 100 nm to approximately 350 nm, for example, may be used for the seed layer 131. In addition, a laminated layer in which a titanium layer having a thickness in a range of approximately 20 nm to approximately 50 nm, and a copper layer having a thickness of approximately 100 nm to approximately 300 nm, for example, are laminated in this order, may be used for the seed layer 131. By forming the titanium layer in a lower layer portion of the seed layer 131, it is possible to improve the adhesion between the insulating layer 12 and the interconnect layer 13. Titanium nitride or the like may be used in place of the titanium forming the lower layer portion of the seed layer 131. Titanium and titanium nitride are metals having a higher corrosion resistance than copper. Then, the electrolytic plating layer (for example, a copper layer) 132 is formed on the seed layer 131 by electrolytic plating using the seed layer 131 as a power feeding layer.

Figure 2B:
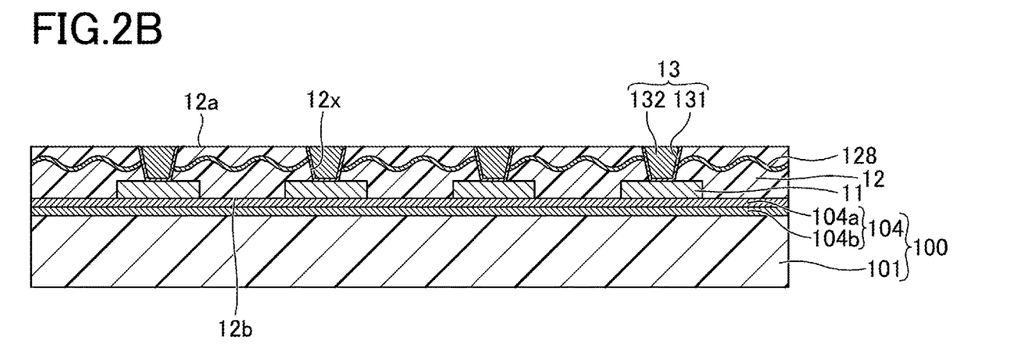

Next, in the process illustrated in FIG. 2B, a top surface of the laminated structure of the seed layer 131 and the electrolytic plating layer 132 illustrated in FIG. 2A is polished to expose the top surface 12a of the insulating layer 12, thereby forming the interconnect layer 13 which is the via interconnect filling the via hole 12x. A Chemical Mechanical Polishing (CMP) or the like, for example, may be used for the polishing of the interconnect layer 13. The top surface of the interconnect layer 13 may coincide with the top surface 12a of the insulating layer 12, for example.

When polishing the interconnect layer 13, a portion of the top surface 12a of the insulating layer 12 may be polished and removed simultaneously therewith. By polishing the top surface 12a of the insulating layer 12 together with the interconnect layer 13 and removing a portion of the top surface 12a of the insulating layer 12, the roughness of the top surface 12a of the insulating layer 12 can be reduced compared to that before the polishing. In other words, it is possible to improve the smoothness of the top surface 12a of the insulating layer 12. The roughness Ra of the top surface 12a of the insulating layer 12 before performing the CMP (before polishing) is in a range of approximately 300 nm to approximately 400 nm, for example. After performing the CMP, the roughness Ra of the top surface 12a of the insulating layer 12 is in a range of approximately 15 nm to approximately 40 nm. Accordingly, by reducing the roughness and improving the smoothness of the top surface 12a of the insulating layer 12, it becomes possible to form a fine-line interconnect (interconnect layer having a high interconnect density) at a later stage of the manufacturing process. The roughness Ra of the bottom surface 12b of the insulating layer 12 is in a range of approximately 180 nm to approximately 280 nm, for example.

Figure 2C:
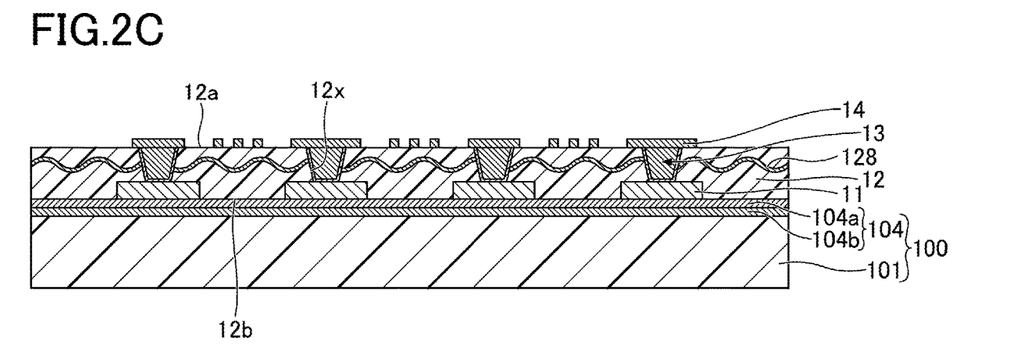

Next, in the process illustrated in FIG. 2C, the interconnect layer 14 having a predetermined pattern is formed on the top surface of the interconnect layer 13 and the top surface 12a of the insulating layer 12. The interconnect layer 14 may be formed using the semi-additive method, similar to the interconnect layer 13. More particularly, a seed layer is first formed by electroless plating or sputtering, so as to continuously cover the top surface of the interconnect layer 13 and the top surface 12a of the insulating layer 12.

Then, a photosensitive resist layer is formed on the entire top surface of the seed layer, and the resist layer is exposed and developed, to thereby form an opening exposing a portion where the interconnect layer 14 is to be formed. Next, an electrolytic plating layer is formed on the top surface of the seed layer exposed inside the opening, by electrolytic plating using the seed layer as a power feeding layer. Then, after stripping the resist layer, the electrolytic plating layer is used as a mask, to remove a portion of the seed layer not covered by the electrolytic plating layer by etching. Hence, the interconnect layer 14, having the electrolytic plating layer laminated on the seed layer, is formed. The material used for the interconnect layer 14, and the thickness, the line-and-space (L/S), or the like of the interconnect layer 14, are as described above. Although the interconnect layer 14 has the laminated structure in which the electrolytic plating layer is laminated on the seed layer, illustration of the seed layer and the electrolytic plating layer in a distinguishable manner is omitted (the same may apply to other interconnect layers) in FIG. 2C or the like.

Figure 3A:
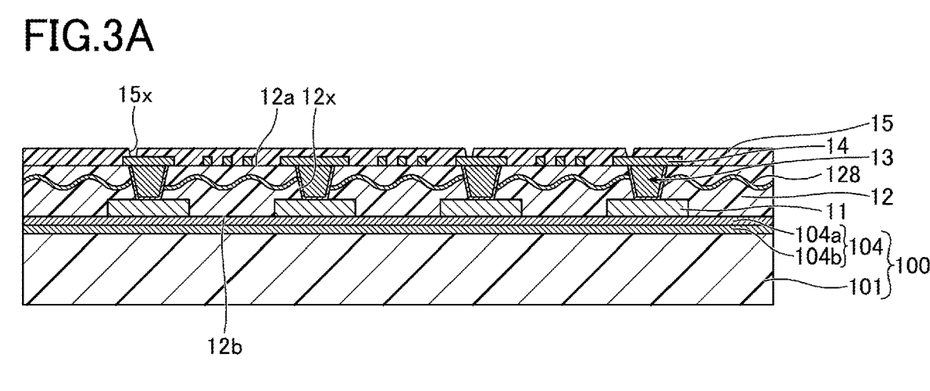
FIG. 3A, FIG. 3B, and FIG. 3C are diagrams (part 2) illustrating the example of the manufacturing process of the wiring board according to the first embodiment.

Next, in the process illustrated in FIG. 3A, after a photosensitive resin in a liquid or paste form is coated on the top surface 12a of the insulating layer 12 so as to cover the interconnect layer 14, the photosensitive resin is heated to a temperature that does not cause complete curing of the photosensitive resin, to thereby form the semi-cured insulating layer 15. The material used for the insulating layer 15, and thickness of the insulating layer 15 are as described above. Next, after forming the via hole 15x by photolithography, for example, the insulating layer 15 is heated to a temperature higher than or equal to a curing temperature of the photosensitive resin, so as to cure the insulating layer 15. The top surface of the insulating layer 15 including the photosensitive resin as the main component thereof is even smoother than the top surface 12a of the insulating layer 12. The roughness Ra of the top surface of the insulating layer 15 may be in a range of approximately 2 nm to approximately 6 nm, for example.

Figure 3B:
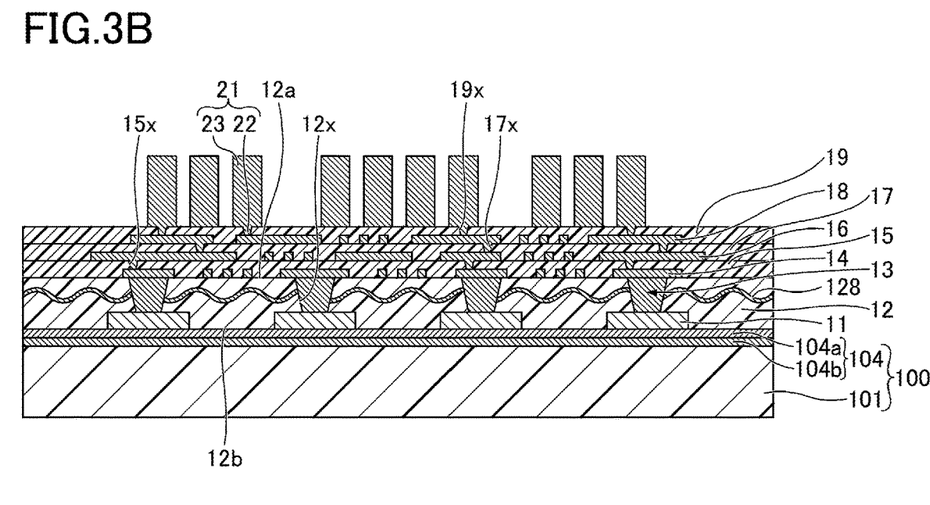

Next, in the process illustrated in FIG. 3B, the interconnect layer 16, the insulating layer 17, the interconnect layer 18, and the insulating layer 19 are formed by repeating processes similar to those illustrated in FIG. 2C and FIG. 3A. Thereafter, the interconnect layer 21 including the via interconnect 22 and the pad 23 is formed by a process similar to that illustrated in FIG. 2C. The thickness and the material used for each of the interconnect layer 16, the insulating layer 17, the interconnect layer 18, the insulating layer 19, and the interconnect layer 21 are as described above.

Figure 3C:
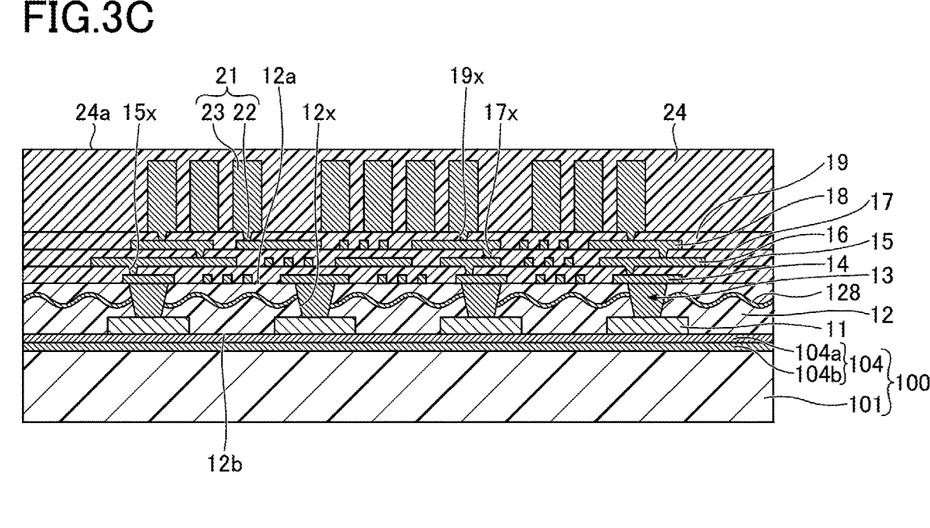

Next, in the process illustrated in FIG. 3C, the encapsulating resin layer 24 is formed on the insulating layer 19, so as to cover the top surface and the side surface of the pads 23 of the interconnect layer 21. The encapsulating resin layer 24 may be formed by mold forming using a mold resin, for example. For example, the structure illustrated in FIG. 3B is accommodated within a mold, and the fluidized mold resin is introduced into the mold by applying a pressure in a range of 5 MPa to 10 MPa, for example. Thereafter, the mold resin is heated to a temperature of approximately 180° C. and cured, to thereby form the encapsulating resin layer 24. After the required encapsulation process is completed, the structure covered with the encapsulating resin layer 24 is removed from the mold. The mold forming may use transfer molding, compression molding, injection molding, or the like, for example.

Figure 4A:
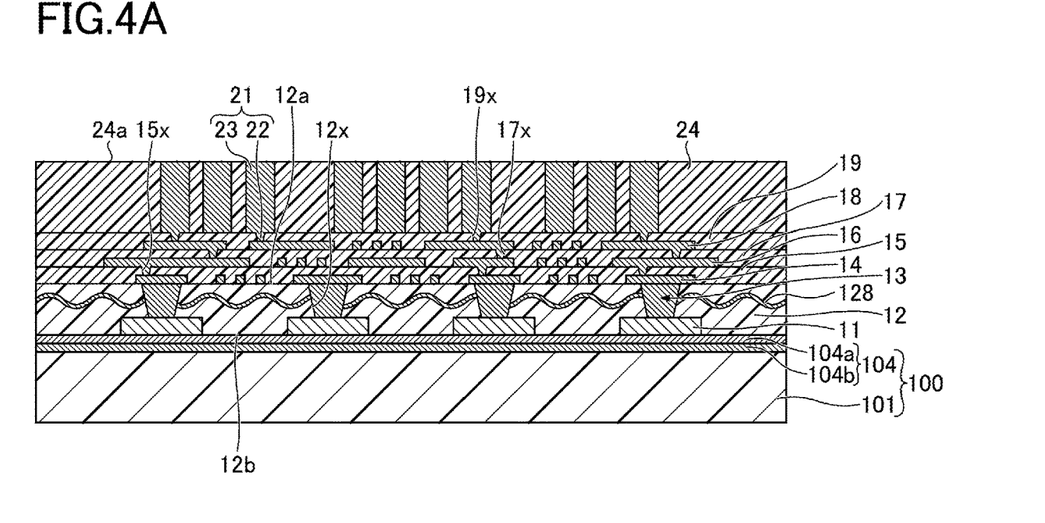
FIG. 4A, FIG. 4B, and FIG. 4C are diagrams (part 3) illustrating the example of the manufacturing process of the wiring board according to the first embodiment.

Next, in the process illustrated in FIG. 4A, the top surface of the encapsulating resin layer 24 illustrated in FIG. 3C is polished, to expose at least the top surface of the pad 23. The CMP or the like, for example, may be used to polish the encapsulating resin layer 24. The top surface of the pad 23 may coincide with the top surface 24a of the encapsulating resin layer 24, for example. However, by adjusting a polishing amount of the encapsulating resin layer 24 or the like, a portion of the side surface and the top surface of the pad 23 may protrude from the top surface 24a of the encapsulating resin layer 24, or the top surface of the pad 23 may be exposed at a more recessed position than the top surface 24a of the encapsulating resin layer 24.

Figure 4B:
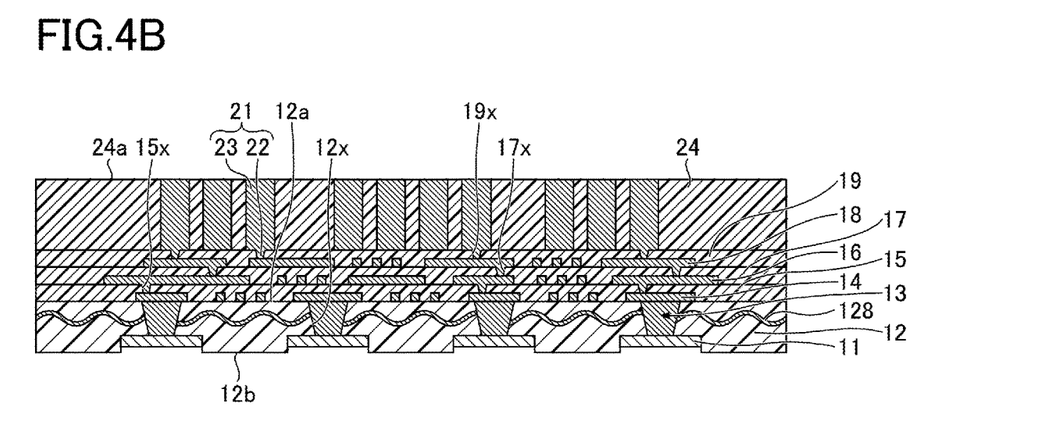

Next, in the process illustrated in FIG. 4B, the support 100 is removed. In order to remove the support 100, the core substrate 101 and thick film 104b are first mechanically stripped from the thin film 104a. Then, the thin film 104a is removed by wet etching using an aqueous ferric chloride solution, an aqueous copper chloride solution, an aqueous ammonium persulfate solution, or the like, for example. In this state, when the interconnect layer 11 is made of copper, the bottom surface of the interconnect layer 11 is also etched, and the bottom surface of the interconnect layer 11 becomes recessed from the bottom surface 12b of the insulating layer 12 toward the interconnect layer 13.

Figure 4C:
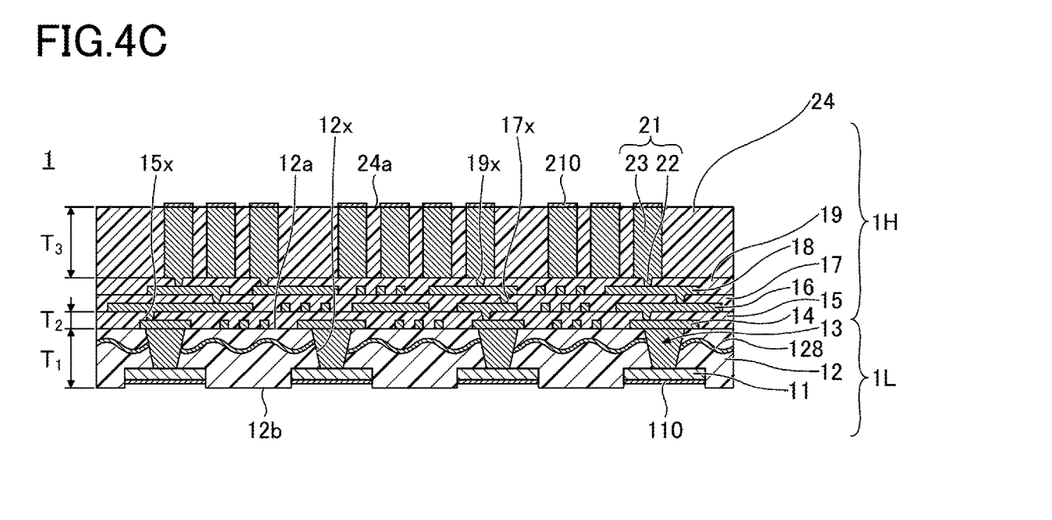

Next, in the process illustrated in FIG. 4C, if necessary, the surface treatment layer 210 is formed on the top surface of the pad 23 of the structure illustrated in FIG. 4B, and the surface treatment layer 110 is formed on the bottom surface of the interconnect layer 11, as appropriate, and the structure is thereafter singulated into individual wiring boards, to complete each wiring board 1. The surface treatment layers 110 and 210 may be a metal layer or a laminated structure of metal layers described above formed by electroless plating, for example, or may be formed by an anti-oxidation treatment, such as the OSP treatment or the like.

As described above, in the wiring board 1, the first interconnect structure 1L including the insulating layer 12 having the non-photosensitive thermosetting resin as the main component thereof, and the encapsulating resin layer 24 having the non-photosensitive thermosetting resin as the main component thereof, are disposed to sandwich therebetween the second interconnect structure 1H including the insulating layers 15, 17, and 19. The thermal expansion coefficient of the insulating layer 12 and the thermal expansion coefficient of the encapsulating resin layer 24 are lower than the thermal expansion coefficient of each of the insulating layers 15, 17, and 19. According to this configuration, it is possible to reduce the warp of the wiring board 1, because an imbalance of the thermal expansion coefficients along the thickness direction of the wiring board 1 is improved.

In addition, because the warp of the wiring board 1 is reduced, it becomes easy to mount the semiconductor chip on the side of the wiring board 1 provided with the encapsulating resin layer 24, and to mount the wiring board 1 on other wiring boards.

The structure in the state illustrated in FIG. 4A may be the form in which the wiring board is forwarded. In other words, the wiring board 1 may be forwarded in the state including the support 100.

Simulation of Warp

With respect to a wiring board (referred to as a wiring board A) having the configuration illustrated in FIG. 1, a simulation was performed for a warp that occurs when the wiring board A heated to 150° C. and then returned to room temperature. More particularly, a planar shape of the wiring board A was set to a rectangular shape of 44 mm×31 mm. In addition, the thickness $T_1$ of the insulating layer 12 was set to 60 μm. Moreover, the thickness $T_2$ of each of the insulating layers 15, 17, and 19 forming the second interconnect structure 1H was set to 5 μm.

Then, the simulation of the warp of the wiring board A was performed for cases where the thickness $T_3$ of the encapsulating resin layer 24 was changed from 10 to 150 μm at 10 μm intervals. As a comparative example, the simulation of the warp of a wiring board (referred to as a wiring board X) having no encapsulating resin layer was performed in a similar manner.

TABLE 1

| Thickness of encapsulating resin layer [μm] | Amount of warp [mm] |
|---|---|
| None | −2.69 |
| 10 | −2.35 |
| 20 | −2.00 |
| 30 | −1.64 |
| 40 | −1.30 |
| 50 | −1.00 |
| 60 | −0.74 |
| 70 | −0.52 |
| 80 | −0.34 |
| 90 | −0.19 |
| 100 | −0.07 |
| 110 | 0.03 |
| 120 | 0.10 |
| 130 | 0.16 |
| 140 | 0.21 |
| 150 | 0.25 |

Figure 5:
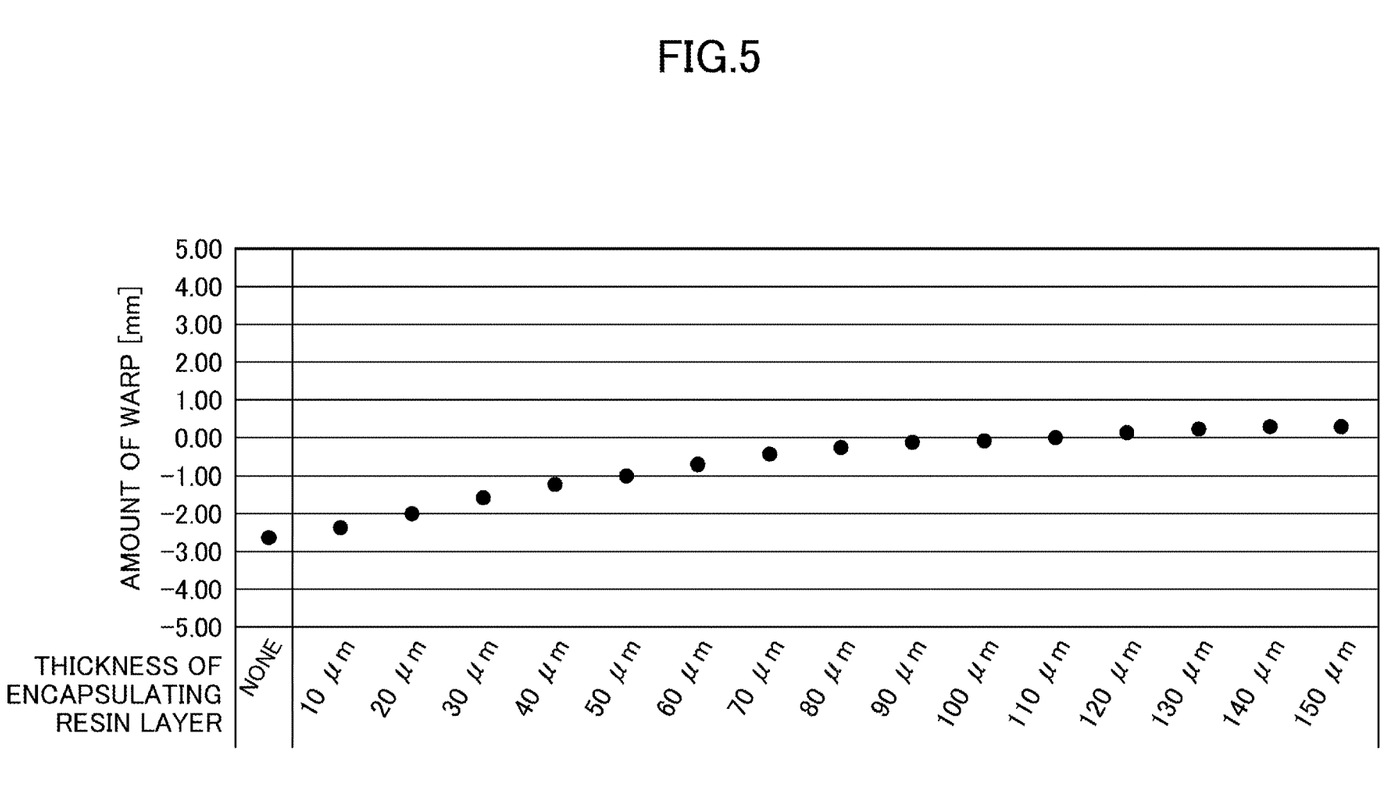
FIG. 5 is a diagram illustrating simulation results.

The simulation results are illustrated in Table 1 and FIG. 5. As illustrated in Table 1 and FIG. 5, in the comparison example having no encapsulating resin layer, the wiring board X is warped in the direction in which the side of the wiring board X provided with the interconnect layer 11 becomes convex, and the amount of warp is −2.69 mm. The amount of warp refers to a distance along the thickness direction of the wiring board between a highest position and a lowest position of the wiring board when the wiring board is placed on a horizontal plane. In addition, a negative value of the amount of warp indicates that the wiring board is warped in the direction in which the side of the wiring board provided with the interconnect layer 11 becomes convex.

On the other hand, when the encapsulating resin layer 24 having a thickness of 10 μm is provided, although the wiring board A warps in the direction in which the side of the wiring board A provided with the interconnect layer 11 becomes convex, similar to the wiring board X, the amount of warp is reduced to −2.35 mm for the wiring board A. When the thickness of the encapsulating resin layer 24 is increased, the amount of warp of the wiring board A is further reduced. When the encapsulating resin layer 24 has a thickness of 110 μm, the direction of the warp changes, the wiring board A warps in the direction in which the side of the wiring board A provided with the interconnect layer 11 becomes concave, and the amount of warp is 0.03 mm. When the thickness of the encapsulating resin layer 24 is increased further, the amount of warp of the wiring board A which warps in the direction in which the side of the wiring board A provided with the interconnect layer 11 becomes concave, increases. When the encapsulating resin layer 24 has a thickness of 150 μm, the amount of warp is 0.25 mm.

Accordingly, it was confirmed that the warp of the wiring board A can be reduced by disposing the insulating layer 12 including the non-photosensitive thermosetting resin as the main component thereof, and the encapsulating resin layer 24, so as to sandwich therebetween the second interconnect structure 1H including the insulating layer 15 having the photosensitive resin as the main component thereof.

In addition, the warp is reduced when the thickness of the encapsulating resin layer 24 is greater than the thickness of the insulating layer 12. More particularly, when the thickness of the insulating layer 12 is 60 μm, the warp can be reduced to ±0.5 mm or less by setting the thickness of the encapsulating resin layer 24 in a range of 80 μm to 150 μm. Moreover, when the thickness of the insulating layer 12 is 60 μm, the warp can be reduced to ±0.2 mm or less by setting the thickness of the encapsulating resin layer 24 in a range of 90 to 130 μm. Further, when the thickness of the insulating layer 12 is 60 μm, the warp can be reduced to ±0.1 mm or less by setting the thickness of the encapsulating resin layer 24 in a range of 100 μm to 120 μm. The imbalance of the thermal expansion coefficient of the insulating layer 12 having the thermosetting resin as the main component thereof, and the thermal expansion coefficients of the insulating layers 15, 17, and 19 having the photosensitive resin as the main component thereof, causes a large warp as in the wiring board X of the comparative example. However, by providing the encapsulating resin layer 24 having the thermosetting resin as the main component thereof, the imbalance of the thermal expansion coefficients improves, to thereby reduce the warp.

When the thickness of the insulating layer 12 is varied, the thickness of the encapsulating resin layer 24 may be adjusted to be greater than the thickness of the insulating layer 12, so as to reduce warp. Accordingly, similar to the simulation results, the warp of the wiring board can be reduced to approximately zero. However, when the thickness of the encapsulating resin layer 24 is increased to 150 μm or greater, the warp gradually increased. In this a case, the warp may affect the mounting of the wiring board A to other wiring boards. For this reason, the thickness of the encapsulating resin layer is set so as to reduce the amount of warp to a range of ±0.1 mm to ±0.5 mm or less. The thickness of the encapsulating resin is preferably set so as to reduce the amount of warp to a range of ±0.1 mm to ±0.2 mm or less.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, the first interconnect structure 1L is not limited to the configuration illustrated in FIG. 1 as long as the first interconnect structure 1L includes the insulating layer 12 having a non-photosensitive thermosetting resin as a main component thereof, and the first interconnect structure 1L may have a multi-level interconnect structure in which interconnect layers are provided in the insulating layer 12.

Accordingly to each of the embodiments of the present disclosure described above, it is possible to provide a wiring board having a reduced warp.

Various aspects of the subject-matter described herein may be set out non-exhaustively in the following numbered clauses:

1. A method for manufacturing a wiring board, comprising:

forming a first interconnect structure including a first interconnect layer, and a first insulating layer that includes a non-photosensitive thermosetting resin as a main component thereof;

forming a second interconnect structure, including a plurality of second interconnect layers, and a plurality of second insulating layers that includes a photosensitive resin as a main component thereof, laminated on the first interconnect structure; and laminating an encapsulating resin layer that includes a non-photosensitive thermosetting resin as a main component thereof on an uppermost layer of the plurality of second insulating layers, wherein an uppermost layer of the plurality of second interconnect layers includes a pad protruding from the uppermost layer of the plurality of second insulating layers, a thermal expansion coefficient of the first insulating layer and a thermal expansion coefficient of the encapsulating resin layer are lower than a thermal expansion coefficient of the plurality of second insulating layers, and the laminating the encapsulating resin layer forms the encapsulating resin layer to cover a top surface and at least a portion of a side surface of the pad, and polishes the encapsulating resin layer on a side closer to the top surface of the pad so as to expose the top surface of the pad.

2. The method for manufacturing the wiring board according to clause 1, wherein the thermal expansion coefficient of the first insulating layer and the thermal expansion coefficient of the encapsulating resin layer are approximately the same.

3. The method for manufacturing the wiring board according to clause 1 or 2, wherein the laminating the encapsulating resin layer laminates the encapsulating resin layer to a thickness greater than a thickness of the first insulating layer.

4. The method for manufacturing the wiring board according to any one of clauses 1 to 3, wherein the forming the first interconnect structure includes a reinforcing member in the first insulating layer.

What is claimed is:

1. A wiring board comprising:

a first interconnect structure including a first interconnect layer, and a first insulating layer that includes a non-photosensitive thermosetting resin as a main component thereof;

a second interconnect structure including a plurality of second interconnect layers, and a plurality of second insulating layers that includes a photosensitive resin as a main component thereof, the second interconnect structure being laminated on the first interconnect structure; and an encapsulating resin layer that includes a non-photosensitive thermosetting resin as a main component thereof, the encapsulating resin layer being laminated on an uppermost layer of the plurality of second insulating layers, wherein an uppermost layer of the plurality of second interconnect layers includes a pad protruding from the uppermost layer of the plurality of second insulating layers, the encapsulating resin layer exposes a top surface of the pad, and covers at least a portion of a side surface of the pad, and a thermal expansion coefficient of the first insulating layer and a thermal expansion coefficient of the encapsulating resin layer are lower than a thermal expansion coefficient of the plurality of second insulating layers.

2. The wiring board as claimed in claim 1, wherein the thermal expansion coefficient of the first insulating layer and the thermal expansion coefficient of the encapsulating resin layer are approximately the same.

3. The wiring board as claimed in claim 1, wherein a thickness of the encapsulating resin layer is greater than a thickness of the first insulating layer.

4. The wiring board as claimed in claim 1, wherein a thermal expansion coefficient of the first insulating layer and a thermal expansion coefficient of the encapsulating resin layer are in a range greater than or equal to 5 ppm/° C. and less than or equal to 10 ppm/° C., and a thermal expansion coefficient of the plurality of second insulating layers is in a range greater than or equal to 5 ppm/° C. and less than or equal to 10 ppm/° C.

5. The wiring board as claimed in claim 1, wherein the first insulating layer includes a reinforcing member.

6. The wiring board as claimed in claim 1, wherein in the first interconnect structure, the first interconnect layer is exposed at a bottom surface of the first insulating layer, the first interconnect structure includes a via interconnect penetrating the first insulating layer and connected to the first interconnect layer, and a lowermost layer of the plurality of second interconnect layers of the second interconnect structure is directly bonded to the via interconnect.

7. The wiring board as claimed in claim 1, wherein the pad is an external connection terminal configured to electrically connect to a semiconductor chip.

* * * * *